(12) United States Patent
Fei et al.

(10) Patent No.: US 9,088,251 B2
(45) Date of Patent: Jul. 21, 2015

(54) OVERCURRENT PROTECTION FOR CLASS D POWER AMPLIFIER

(71) Applicants: Haibo Fei, San Diego, CA (US); Matthew D. Sienko, San Diego, CA (US); Chenling Huang, San Diego, CA (US)

(72) Inventors: Haibo Fei, San Diego, CA (US); Matthew D. Sienko, San Diego, CA (US); Chenling Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 25 days.

(21) Appl. No.: 13/646,585

(22) Filed: Oct. 5, 2012

(65) Prior Publication Data

US 2013/0285744 A1 Oct. 31, 2013

Related U.S. Application Data

(60) Provisional application No. 61/639,035, filed on Apr. 26, 2012.

(51) Int. Cl.
*H03F 3/45* (2006.01)
*H03F 1/52* (2006.01)
*H03F 3/217* (2006.01)

(52) U.S. Cl.
CPC . *H03F 3/45* (2013.01); *H03F 3/217* (2013.01)

(58) Field of Classification Search
CPC ................................... H03F 3/45; H03F 3/217

USPC ..................... 330/10, 251, 207 A, 207 P, 298
See application file for complete search history.

(56) References Cited

U.S. PATENT DOCUMENTS

| 5,220,207 | A | 6/1993 | Kovalcik et al. |
| 7,157,968 | B2 | 1/2007 | Shin |
| 7,733,171 | B2 | 6/2010 | Guilherme et al. |
| 2005/0253648 | A1 | 11/2005 | Shin |
| 2009/0097178 | A1 | 4/2009 | Krishnan et al. |
| 2009/0153251 | A1 | 6/2009 | Cheng et al. |
| 2011/0188163 | A1 | 8/2011 | Ando |
| 2011/0267731 | A1 | 11/2011 | Amadi et al. |

OTHER PUBLICATIONS

International Search Report and Written Opinion—PCT/US2013/034965—ISA/EPO—Jun. 13, 2013.

(Continued)

*Primary Examiner* — Benny Lee
*Assistant Examiner* — Khiem Nguyen
(74) *Attorney, Agent, or Firm* — Howard Seo

(57) ABSTRACT

In an aspect of the disclosure, a class D power amplifier with an overcurrent protection (OCP) circuit is provided. The class D power amplifier includes a plurality of output transistors, and the OCP circuit is mirrored to at least one output transistor of the plurality of output transistors in a closed-loop feedback configuration for precisely controlling a sensing current of the OCP circuit with respect to an output current of the at least one output transistor. The class D power amplifier with the OCP circuit in the closed-loop feedback configuration mitigates a variation in a current threshold value for triggering interruption of the class D power amplifier.

30 Claims, 8 Drawing Sheets

(56) References Cited

OTHER PUBLICATIONS

Lee., C.F., et al., "On-chip current sensing technique for CMOS monolithic switch-mode power converters", 2002 IEEE International Symposium on Circuits and Systems. Proceedings (Cat. No. 02CH37353), vol. 5, Jan. 1, 2002, pp. V-265, XP055065041, DOI: 10.1109/ISCAS.2002.1010691 ISBN: 978-0-78-037448-5.

Marco Berkhout, "Integrated Overcurrent Protection System for Class-D Audio Power Amplifiers", IEEE journal of solid-state circuits, vol. 40, No. 11, Nov. 2005, pp. 2237-2245.

US 9,088,251 B2

OVERCURRENT PROTECTION FOR CLASS D POWER AMPLIFIER

CROSS-REFERENCE TO RELATED APPLICATION(S)

This application claims the benefit of U.S. Provisional Application Ser. No. 61/639,035, entitled "OVERCURRENT PROTECTION FOR CLASS D POWER AMPLIFIER" and filed on Apr. 26, 2012, which is expressly incorporated by reference herein in its entirety.

BACKGROUND

1. Field

The present disclosure relates generally to electronic circuits, and more particularly, to an overcurrent protection circuit for a class D power amplifier.

2. Background

Power amplifiers are commonly used in various applications such as speaker drivers, headphone amplifiers, telephone line drivers, etc. Power amplifiers are categorized into different classes such as class A, class B, class AB, class G, class H, and class D. Class A, B, G, and AB amplifiers are linear amplifiers that operate in a linear region. Class D amplifiers are switch mode amplifiers that power devices operating in either deep-triode or cut-off regions. Consequently, class D amplifiers can typically achieve much higher power efficiency than linear amplifiers.

Generally, a class D amplifier may adopt a current sensor to detect output current, wherein a current minor copies an output current to another circuit by a very small proportion, and detects whether the copied current exceeds a threshold. However, when realized with an integrated circuit, the conventional current detection circuit is not very dependable, less power-efficient, and less space-efficient. Accordingly, what is needed is a current detection circuit for a class D power amplifier overcurrent protection that is robust, more power-efficient, and more space-efficient.

SUMMARY

A class D amplifier with existing overcurrent protection (OCP) circuitry is problematic because the existing OCP circuitry experiences large variations in a current threshold value for triggering interruption of the class D amplifier. The threshold value may likely vary according to: 1) a process for fabricating the OCP circuit and a class D power amplifier; 2) a supply voltage at which the OCP circuit and the class D power amplifier are operated; 3) a temperature at which the OCP circuit and the class D power amplifier are operated; or 4) a mismatch between a current sensing circuit of the OCP and class D amplifier output devices. Accordingly, a class D power amplifier with an OCP circuit is provided which mitigates the variation in the output current threshold value for triggering interruption of the class D amplifier.

In an aspect of the disclosure, a class D power amplifier with an overcurrent protection (OCP) circuit includes a class D power amplifier having a plurality of output transistors, and an OCP circuit coupled to at least one output transistor of the plurality of output transistors in a closed-loop feedback configuration for controlling a current sensing circuit with respect to an output current of the at least one output transistor.

DETAILED DESCRIPTION

Figure 1:
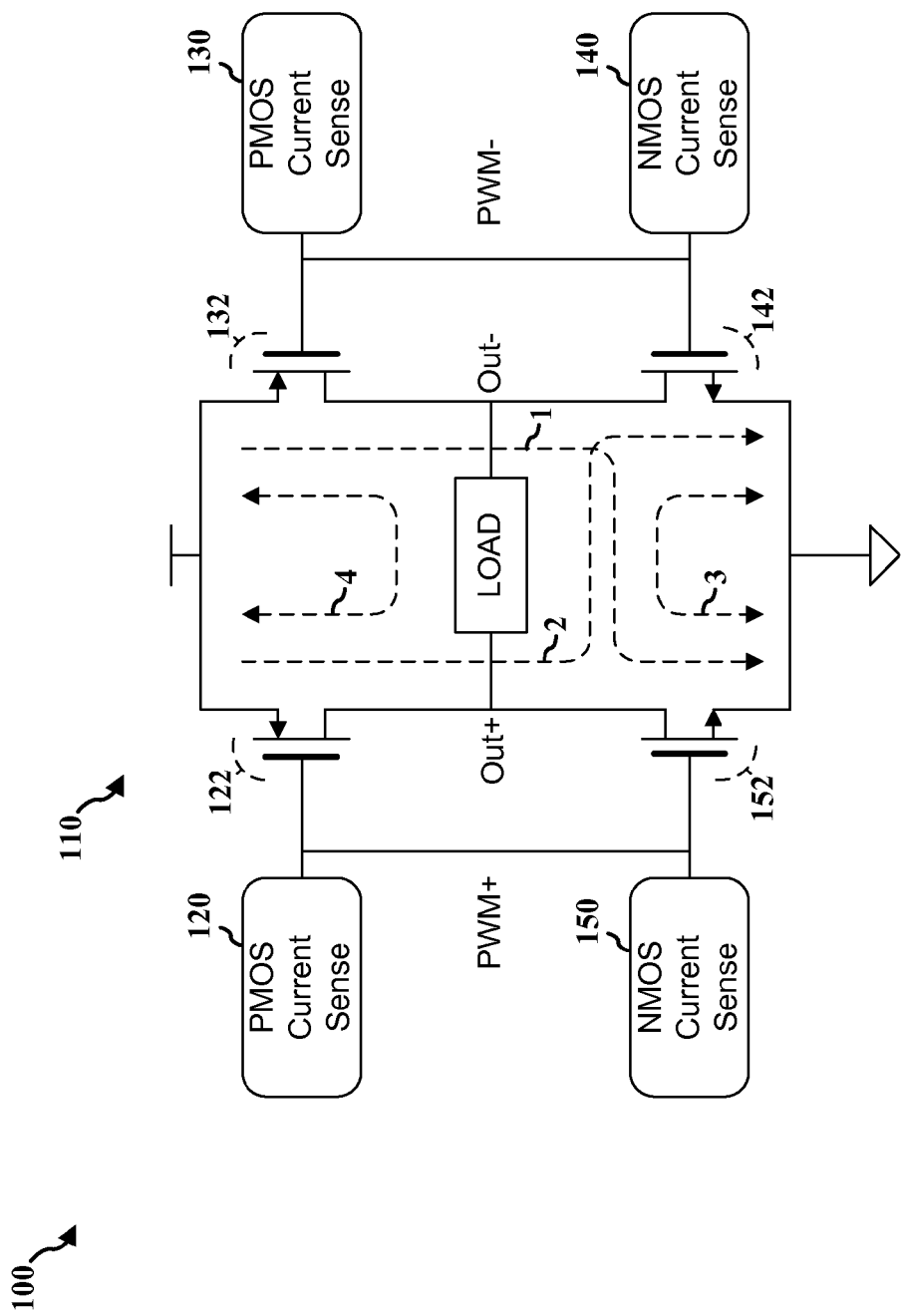
FIG. 1 is a diagram illustrating a three-state class D power amplifier with at least one overcurrent protection (OCP) circuit actively monitoring an output current.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of electronic circuits will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

As output power of a class D amplifier increases, overcurrent protection (OCP) becomes more important for protecting output devices of the class D power amplifier from overheating and eventually breaking down. To avoid this catastrophic failure, an OCP circuit should be robust. That is, the OCP circuit should immediately activate to interrupt operation of the class D amplifier upon sensing an output current over a threshold value. However, the OCP circuit should also avoid activating while the class D amplifier operates normally. Ideally, the OCP circuit operates with low power consumption and occupies a minimum die area.

An existing class D amplifier either has no OCP circuitry, or is coupled with problematic OCP circuitry. Existing OCP circuitry is problematic because it experiences very large variations in a current threshold value for triggering interruption of the class D amplifier. The threshold value may vary according to: 1) a process for fabricating the OCP circuit and a class D power amplifier; 2) a supply voltage at which the OCP circuit and the class D power amplifier are operated; 3) a temperature at which the OCP circuit and the class D power amplifier are operated; or 4) a mismatch between the OCP circuit and a class D amplifier power stage. Because of these factors, the existing OCP circuitry may experience an output current threshold value variation of over 100% with respect to a target output current threshold value. Consequently, the class D amplifier with the existing OCP circuitry is more prone to failure because the OCP circuitry is less likely to interrupt operation of the class D amplifier when the output current is near the target threshold value for triggering interruption. Accordingly, in an aspect of the disclosure, a class D power amplifier with an OCP circuit is provided which mitigates the variation in the output current threshold value.

The class D amplifier may be used with a modulation technique such as pulse width modulation (PWM) or pulse density modulation (PDM). A PWM modulator may receive an analog input signal and a carrier signal and generate a PWM signal that controls the switching of the class D amplifier. The PWM signal has a variable duty cycle determined by the amplitude of the analog input signal and a fixed switching frequency determined by the frequency of the carrier signal. The carrier signal may have a sawtooth waveform or a triangular waveform. Any deviation from an ideal sawtooth or triangular waveform may cause distortion in an output signal from the class D amplifier.

A PDM modulator may receive an analog input signal and generate a PDM signal that controls the switching of the output devices of the class D amplifier. The PDM signal has a duty cycle determined by the analog input signal and may have a variable switching frequency determined by circuit components within the PDM modulator. The values of the circuit components may vary widely due to integrated circuit (IC) process variations and other factors. Hence, the switching frequency of the PDM signal may also vary widely.

FIG. 1 is a diagram 100 illustrating a three-state class D power amplifier 110 with at least one overcurrent protection (OCP) circuit monitoring an output load current. Referring to FIG. 1, the class D power amplifier 110 may be an H-bridge amplifier. A three-state output stage may have four different current flow routines 1, 2, 3, 4. The amplifier 110 may include a first OCP circuit (PMOS current sense/PMOS sensing circuit) 120 connected to a first output device 122 of an H-bridge stage, a second OCP circuit (PMOS current sense/PMOS sensing circuit) 130 connected to a second output device 132 of the H-bridge stage, a third OCP circuit (NMOS current sense/NMOS sensing circuit) 140 connected to a third output device 142 of the H-bridge stage, and a fourth OCP circuit (NMOS current sense/NMOS sensing circuit) 150 connected to a fourth output device 152 of the H-bridge stage.

Figure 2:
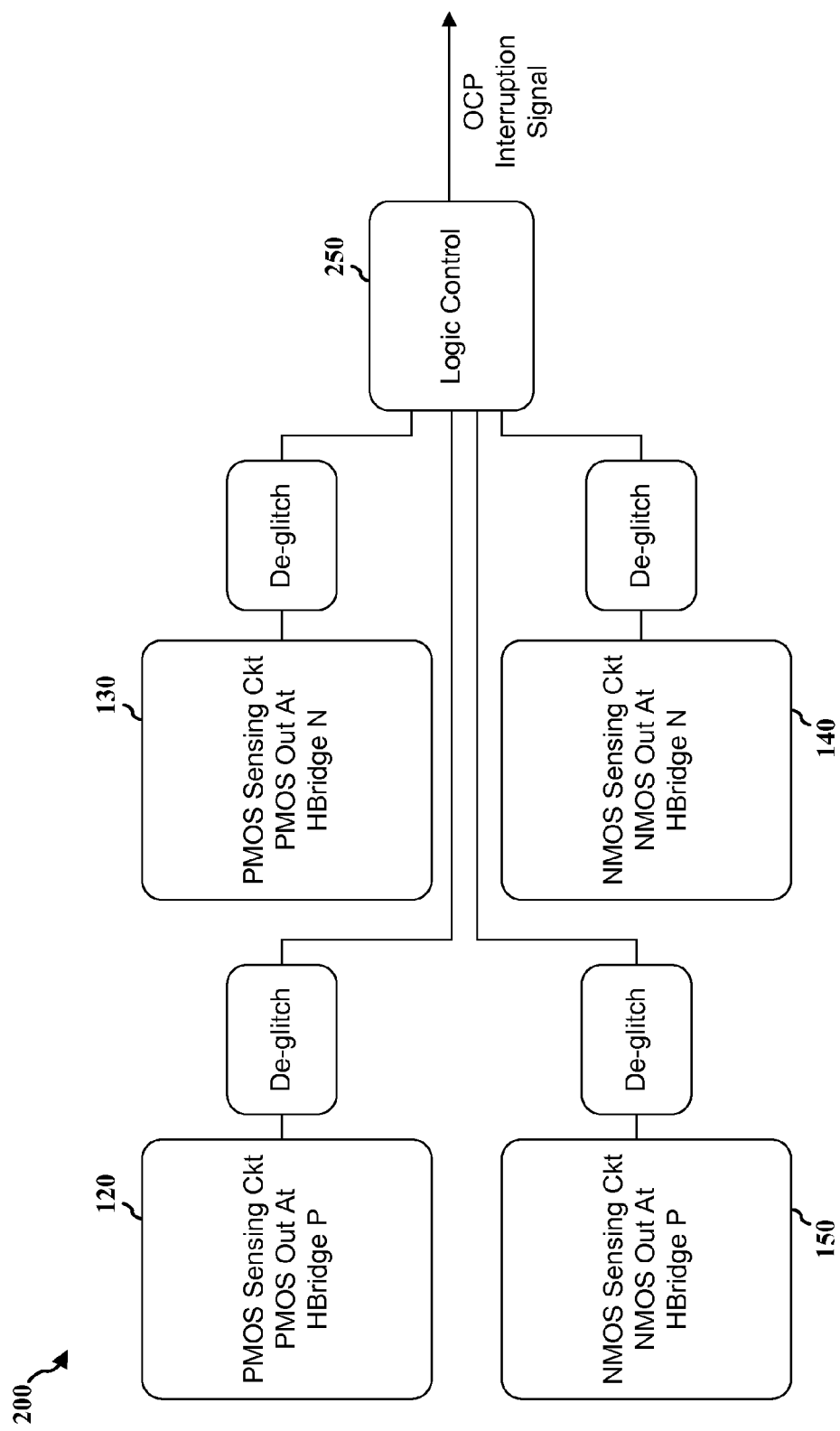
FIG. 2 is a block diagram of the OCP circuit of the three-state class D power amplifier of FIG. 1.

FIG. 2 is a block diagram 200 of the OCP circuit of the three-state class D power amplifier of FIG. 1. To ensure that at least one OCP circuit will be active to monitor an operating current, a sensing cell may be located adjacent to each output device of an H-bridge stage. For example, referring to FIGS. 1 and 2, the PMOS sensing circuit 120 may be located adjacent and connected to an output PMOS 122 at H-bridge P. The PMOS sensing circuit 130 may be located adjacent and connected to an output PMOS 132 at H-bridge N. The NMOS sensing circuit 140 may be located adjacent and connected to an output NMOS 142 at H-bridge N. The NMOS sensing circuit 150 may be located adjacent and connected to an output NMOS 150 at H-bridge P. When any one of the OCP circuits is triggered (e.g., senses a current above a threshold value), a respective OCP circuit will send an interruption signal to a logic control circuit 250 for interrupting operation of the class D power amplifier immediately.

Figure 3:
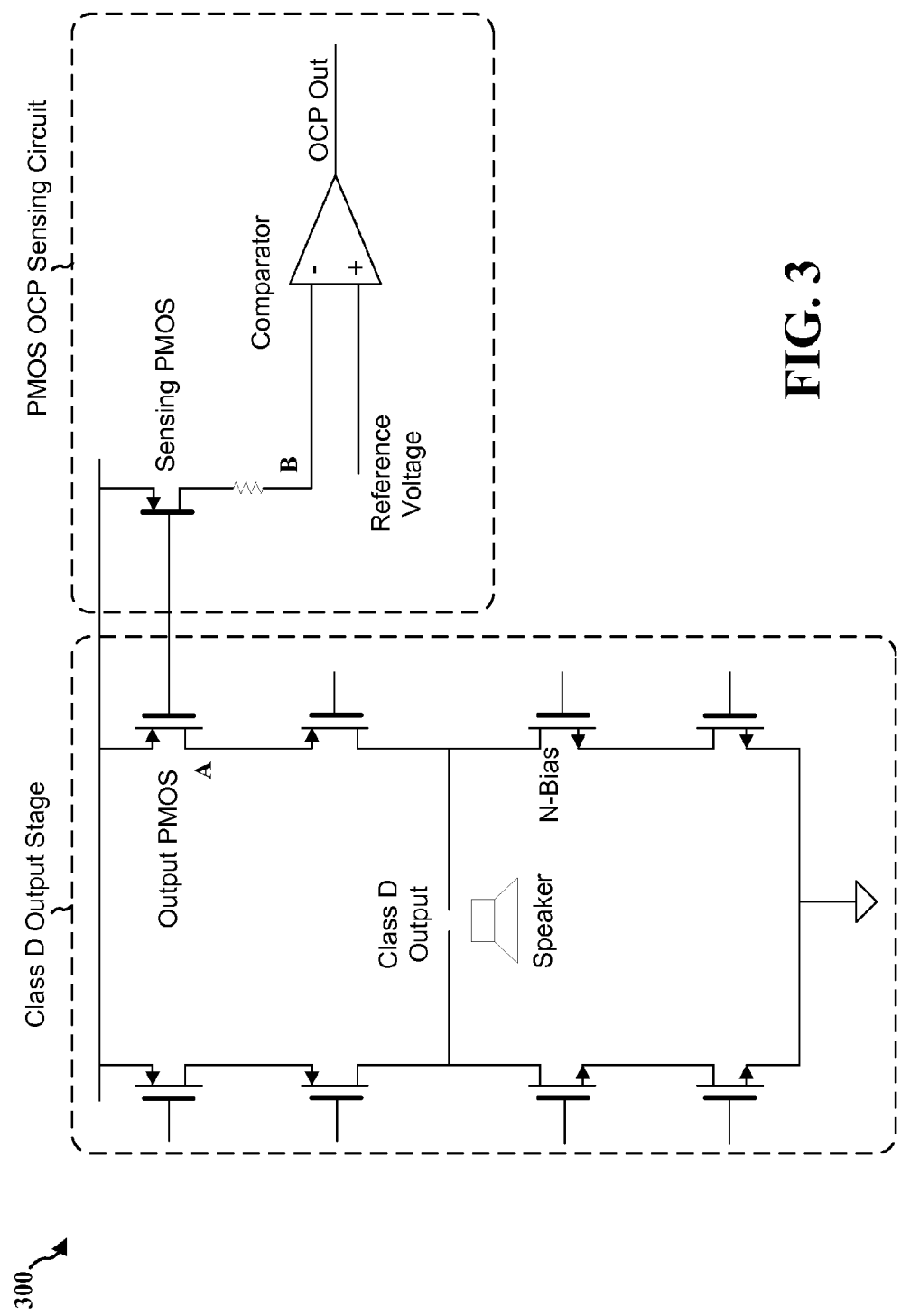
FIG. 3 is a diagram illustrating a class D power amplifier with an overcurrent protection (OCP) circuit.

FIG. 3 is a diagram 300 illustrating a class D power amplifier with an overcurrent protection (OCP) circuit. Referring to FIG. 3, a class D output stage is coupled to an OCP circuit in an open-loop configuration. Here, an output of the class D output stage is sensed by a sensing PMOS of the OCP circuit. The sensed output of the class output stage is then fed to a comparator of the OCP circuit to produce an OCP circuit output. However, the OCP circuit of FIG. 3 is problematic because of the lack of closed-loop control. Due to the open-loop configuration, the OCP circuit of FIG. 3 suffers from huge variations in output current threshold levels, and therefore the class D amplifier will suffer from false triggering or failed triggering.

Figure 4:
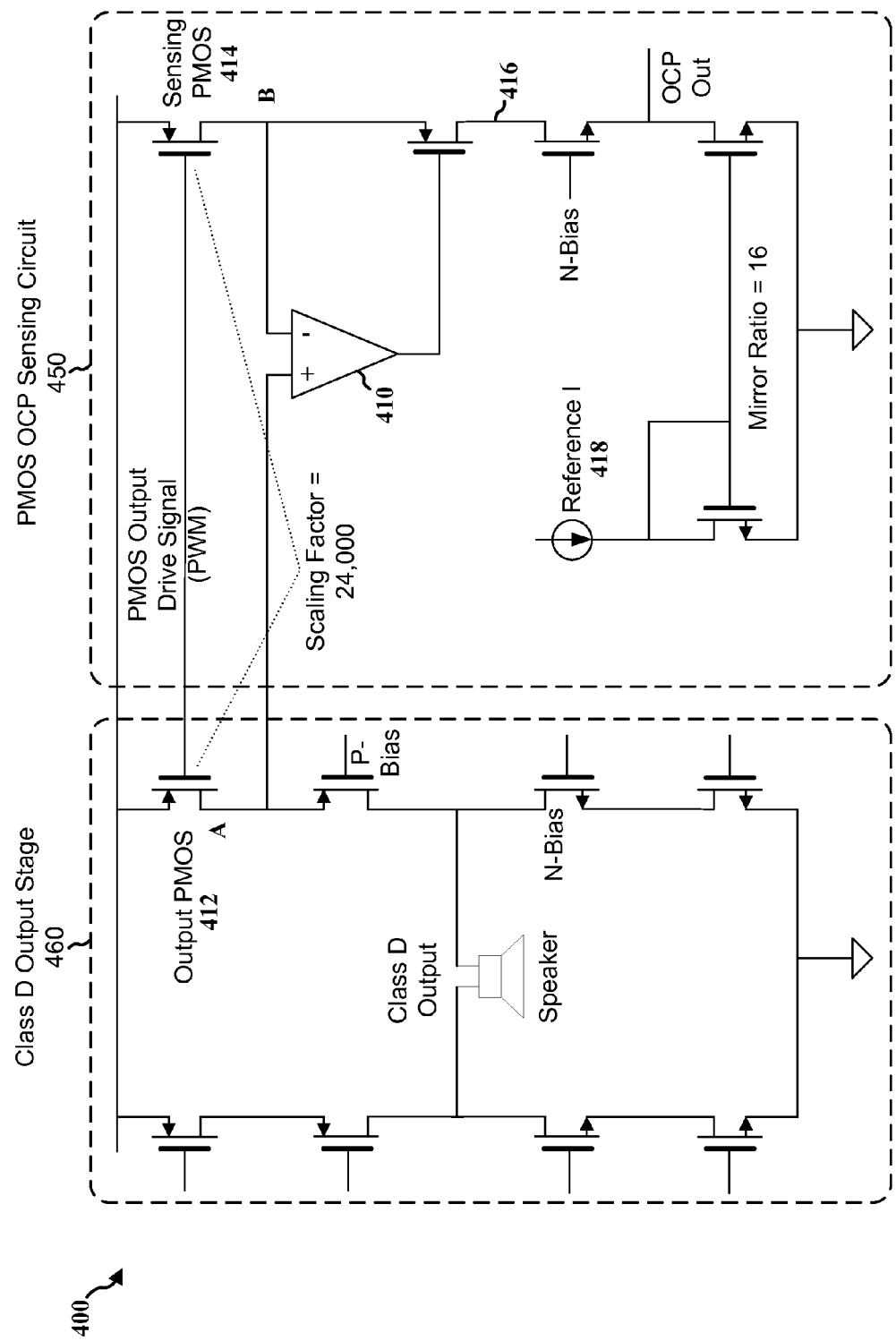
FIG. 4 is a diagram of a PMOS OCP sensing circuit mirroring a class D output stage in a closed-loop configuration.
Figure 5:
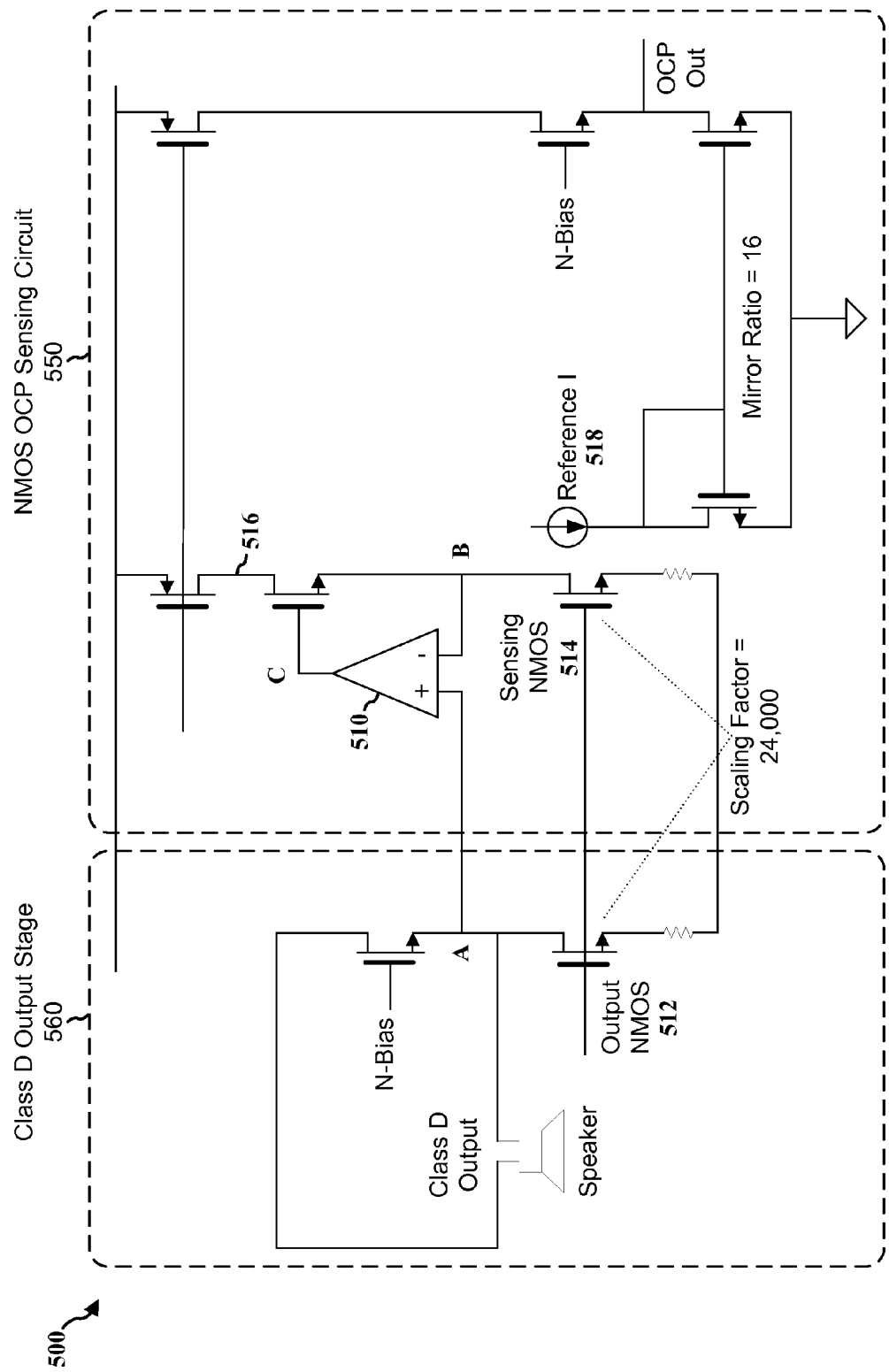
FIG. 5 is a diagram of an NMOS OCP sensing circuit mirroring to a class D output stage in a closed-loop configuration.

FIG. 4 is a diagram 400 of a PMOS OCP sensing circuit 450 mirroring an output device of a class D output stage 460 in a closed-loop configuration. FIG. 5 is a diagram 500 of an NMOS OCP sensing circuit 550 mirroring an output device of a class D output stage 560 in a closed-loop configuration. Referring to FIGS. 4 and 5, an output current of the class D output stage 460, 560 is scaled down by a factor of 24,000. A reference current may be 8 μA. The value of 24,000 may be derived by dividing a device-size ratio W/L of an output transistor by a device-size ratio W/L of a sensing transistor, wherein W is a width and L is a length of the device. Hence, in an aspect, the scaling factor $A=(W/L)_{output}/(W/L)_{sense}=24,000$.

An operational amplifier 410, 510 utilized in the OCP circuit allows a voltage at node A to be nearly equal to a voltage at node B (see FIGS. 4 and 5) so that a ratio of a current passing through an output device 412, 512 and a current passing though a sensing device 414, 514 will be precisely defined by a geometrical ratio. As such, the OCP circuits 450 and 550 of FIGS. 4 and 5, respectively, will experience very small variations in current threshold levels for triggering interruption of a class D power amplifier and consume very little quiescent power.

Referring to FIGS. 4 and 5, a class D power amplifier with an overcurrent protection (OCP) circuit includes a class D power amplifier 460, 560 having a plurality of output transistors 412, 512 and an OCP circuit 450, 550 mirroring at least one output transistor 412, 512 of the plurality of output transistors in a closed-loop feedback configuration. In FIG. 5, only a portion of an H-bridge is shown in the class D output stage 560. However, the class D output stage 560 of FIG. 5 may include an entire H-bridge similar to the class D output stage 460 of FIG. 4. The closed-loop feedback configuration allows a sensing current of the OCP circuit 450, 550 to be precisely controlled with respect to an output current of the at least one output transistor 412, 512.

The OCP circuit 450, 550 interrupts operation of the class D power amplifier 460, 560 when the sensing current exceeds a threshold. However, the threshold may vary according to at least one of: 1) a process for fabricating the OCP circuit and a class D power amplifier; 2) a supply voltage at which the OCP circuit and the class D power amplifier are operated; 3) a temperature at which the OCP circuit and the class D power amplifier are operated; or 4) a mismatch between the OCP circuit and class D power amplifier. Moreover, the OCP circuit controls a value of the sensing current to be a ratio of a value of the output current of the at least one output transistor.

Each of the plurality of output transistors 412, 512 of the class D power amplifier 460, 560 comprises a gate node, a drain node, and a source node. The OCP circuit 450, 550 comprises a sensing transistor 414, 514 comprising a sensing transistor gate node, a sensing transistor drain node, and a sensing transistor source node. The closed-loop feedback configuration controls the sensing current of the OCP circuit 450, 550 by facilitating a voltage across the sensing transistor drain node and sensing transistor source node of the sensing transistor 414, 514 to be very close to equal to a voltage across the drain node and source node of the at least one output transistor 412, 512.

The OCP circuit 450, 550 is connected to the gate node and the drain node of the at least one output transistor 412, 512. Moreover, the sensing transistor gate node of the sensing transistor 414, 514 is connected to the gate node of the at least one output transistor 412, 512.

The OCP circuit 450, 550 also comprises the operational amplifier 410, 510 for controlling input node voltages within a closed-loop feedback. The operational amplifier 410, 510 includes an output node, a first input node, and a second input node. The first input node of the operational amplifier 410, 510 is connected to the drain node of the at least one output transistor 412, 512, and the second input node of the operational amplifier 410, 510 is connected to the sensing transistor drain node of the sensing transistor 414, 514.

The OCP circuit further also comprises a cascode 416, 516 and a programmable reference current circuit 418, 518 for supplying a reference current to the OCP circuit. The output node of the operational amplifier 410, 510 is connected to a gate node of the cascode 416, 516. The second input node of the operational amplifier 410, 510 is connected to a source node of the cascode 416, 516. The reference current circuit 418, 518 is mirrored to a drain node of the cascode 416, 516.

As shown in FIG. 4, the at least one output transistor 412 is a PMOS transistor and the sensing transistor 414 is a PMOS transistor. As shown in FIG. 5, the at least one output transistor 512 is a NMOS transistor and the sensing transistor 514 is a NMOS transistor.

In an aspect of the disclosure, the OCP sensing circuit 450, 550 connected to a class D output stage 460, 560 in a closed-loop configuration exhibits very small variations including PVT (process, voltage supply, and temperature) and random variations. Table 1 below shows simulated percentages of variation of an output current threshold for NMOS and PMOS when compared to a target threshold value. As seen in Table 1, the OCP sensing circuit mirroring the class D output stage in the closed-loop configuration is a significant improvement to existing OCP circuits which may suffer from variations of over 100%.

TABLE 1

| OCP Limits (A) | NMOS | | PMOS | |
| --- | --- | --- | --- | --- |
| | Threshold (A) | Variation (%) | Threshold (A) | Variation (%) |
| TYP | 2.992 | 0 | 2.937 | 0 |
| PVT Min − 3σ | 2.52 | −15.78% | 2.43 | −17.26% |
| PVT Max + 3σ | 3.57 | 19.32% | 3.51 | 19.51% |

Table 2 below shows how the OCP sensing circuit 450, 550 coupled to the class D output stage 460, 560 in the closed-loop configuration consumes very little quiescent current.

TABLE 2

| Input Level | NMOS (µA) | PMOS (µA) | Total (µA) |
| --- | --- | --- | --- |
| 0.7 * full scale | 58.6 | 67.6 | 252.4 |
| 0 | 23.6 | 18.25 | 83.7 |

Figure 6:
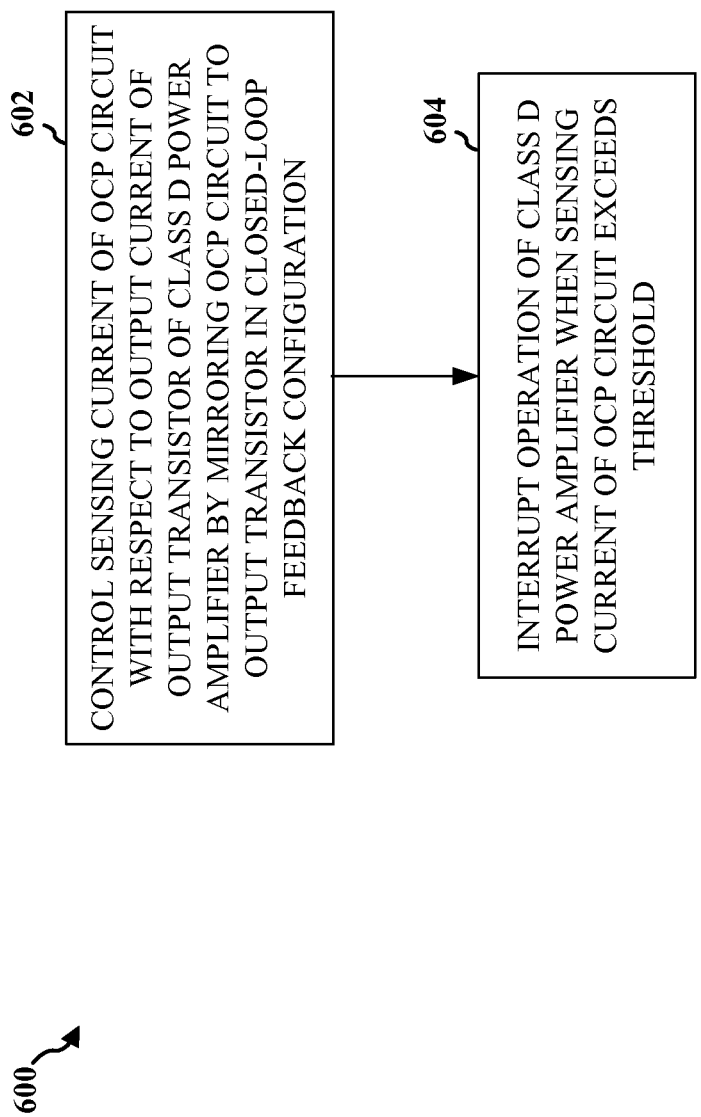
FIG. 6 is a flow chart of a method of controlling a class D power amplifier.

FIG. 6 is a flow chart 600 of a method of controlling a class D power amplifier. The class D power amplifier includes a plurality of output transistors and an overcurrent protection (OCP) circuit. The method may be performed by the class D power amplifier. At step 602, the class D power amplifier controls a sensing current of the OCP circuit with respect to an output current of at least one output transistor of the plurality of output transistors. The sensing current may be controlled by mirroring the OCP circuit to the at least one output transistor in a closed-loop feedback configuration. At step 604, operation of the class D power amplifier is interrupted when the sensing current of the OCP circuit exceeds a threshold.

The threshold may vary according to at least one of a process for fabricating the OCP circuit and the class D power amplifier, a supply voltage at which the OCP circuit and the class D power amplifier are operated, a temperature at which the OCP circuit and the class D power amplifier are operated, or a mismatch between the OCP circuit and the class D power amplifier.

In an aspect, the class D power amplifier controls a value of the sensing current of the OCP circuit to be a ratio of a value of the output current of the at least one output transistor. In a further aspect, each of the plurality of output transistors of the class D power amplifier comprises a gate node, a drain node, and a source node, and the OCP circuit comprises a sensing transistor comprising a sensing transistor gate node, a sensing transistor drain node, and a sensing transistor source node. Accordingly, the closed-loop feedback configuration controls the sensing current of the OCP circuit by facilitating a voltage across the sensing transistor drain node and sensing transistor source node to be very close to equal to a voltage across the drain node and source node of the at least one output transistor.

The OCP circuit may be connected to the gate node and the drain node of the at least one output transistor. The sensing transistor gate node may be connected to the gate node of the at least one output transistor.

In another aspect, the OCP circuit further includes an operational amplifier for controlling input node voltages within a closed-loop feedback. The operational amplifier includes an output node, a first input node, and a second input node. As such, the class D power amplifier may connect the first input node to the drain node of the at least one output transistor and connect the second input node to the sensing transistor drain node.

In a further aspect, the OCP circuit further includes a cascode and a programmable reference current circuit for supplying a reference current to the OCP circuit. As such, the class D power amplifier may connect the output node of the operational amplifier to a gate node of the cascode, connect the second input node of the operational amplifier to a source node of the cascode, and couple the reference current circuit to a drain node of the cascode.

The at least one output transistor may be a PMOS transistor and the sensing transistor may be a PMOS transistor. Alternatively, the at least one output transistor may be a NMOS transistor and the sensing transistor may be a NMOS transistor.

Figure 7:
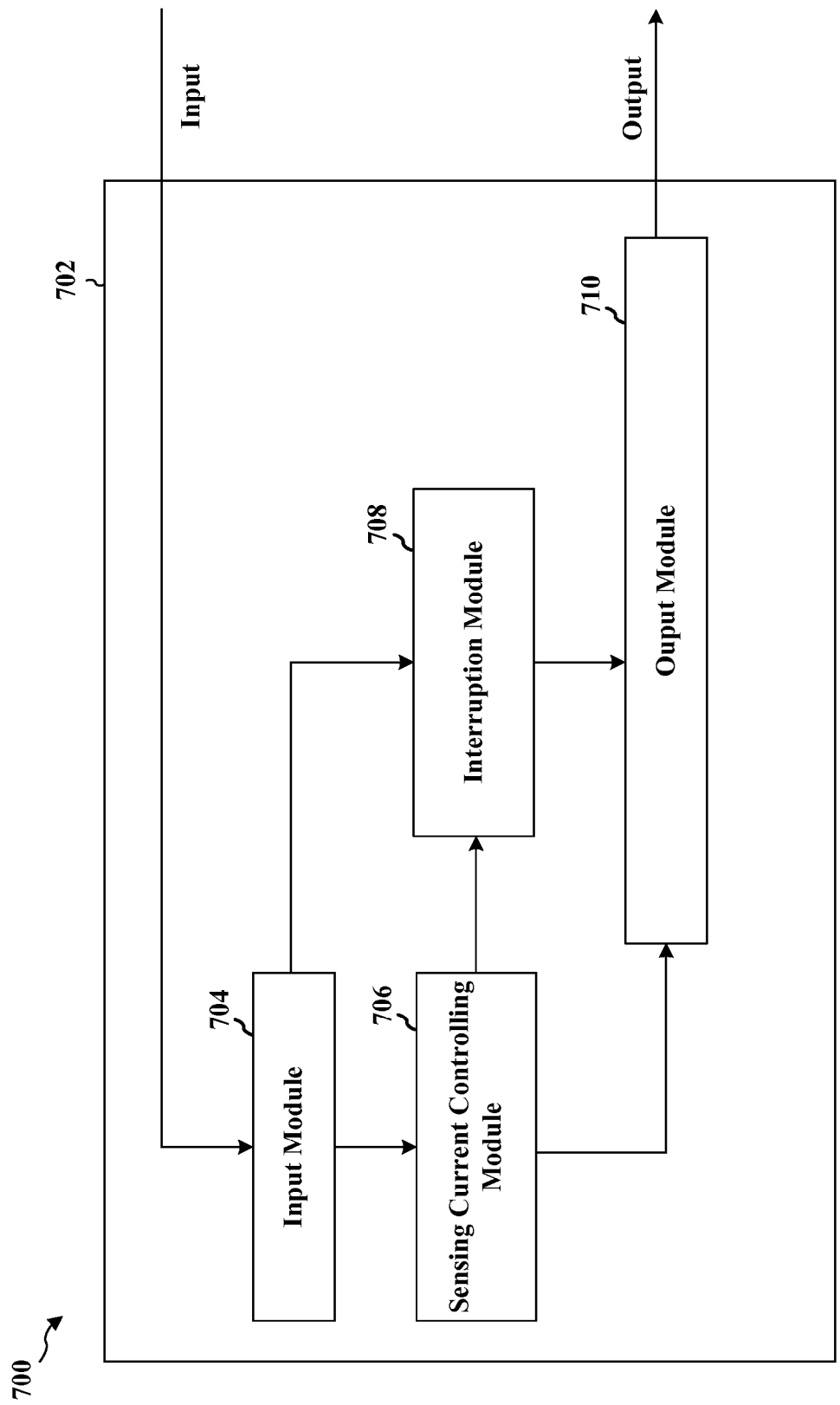
FIG. 7 is a conceptual data flow diagram illustrating the data flow between different modules/means/components in an exemplary apparatus.

FIG. 7 is a conceptual data flow diagram 700 illustrating the data flow between different modules/means/components in an exemplary apparatus 702. The apparatus may be a class D power amplifier including a plurality of output transistors and an overcurrent protection (OCP) circuit. The apparatus includes an input module 704 that receives an input, a sensing current controlling module 706, an interruption module 708, and an output module 710 that sends an output.

The sensing current controlling module 706 controls a sensing current of the OCP circuit with respect to an output current of at least one output transistor of the plurality of output transistors. The sensing current may be controlled by mirroring the OCP circuit to the at least one output transistor in a closed-loop feedback configuration. The interruption module 708 interrupts operation when the sensing current of the OCP circuit exceeds a threshold.

The threshold may vary according to at least one of a process for fabricating the OCP circuit and the class D power amplifier, a supply voltage at which the OCP circuit and the class D power amplifier are operated, a temperature at which the OCP circuit and the class D power amplifier are operated, or a mismatch between the OCP circuit and the class D power amplifier.

In an aspect, the sensing current controlling module 706 controls a value of the sensing current of the OCP circuit to be a ratio of a value of the output current of the at least one output transistor. In a further aspect, each of the plurality of output transistors of the class D power amplifier comprises a gate node, a drain node, and a source node, and the OCP circuit comprises a sensing transistor comprising a sensing transistor gate node, a sensing transistor drain node, and a sensing transistor source node. Accordingly, the closed-loop feedback configuration controls the sensing current of the OCP circuit by facilitating a voltage across the sensing transistor drain node and sensing transistor source node to be very close to equal to a voltage across the drain node and source node of the at least one output transistor.

The OCP circuit may be connected to the gate node and the drain node of the at least one output transistor. The sensing transistor gate node may be connected to the gate node of the at least one output transistor.

In another aspect, the OCP circuit further includes an operational amplifier for controlling input node voltages within a closed-loop feedback. The operational amplifier includes an output node, a first input node, and a second input node. As such, the sensing current controlling module 706 may connect the first input node to the drain node of the at least one output transistor and connect the second input node to the sensing transistor drain node.

In a further aspect, the OCP circuit further includes a cascode and a programmable reference current circuit for supplying a reference current to the OCP circuit. As such, the sensing current controlling module 706 may connect the output node of the operational amplifier to a gate node of the cascode, connect the second input node of the operational amplifier to a source node of the cascode, and couple the reference current circuit to a drain node of the cascode.

The at least one output transistor may be a PMOS transistor and the sensing transistor may be a PMOS transistor. Alternatively, the at least one output transistor may be a NMOS transistor and the sensing transistor may be a NMOS transistor.

The apparatus may include additional modules that perform each of the steps of the algorithm in the aforementioned flow chart of FIG. 6. As such, each step in the aforementioned flow chart of FIG. 6 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 8:
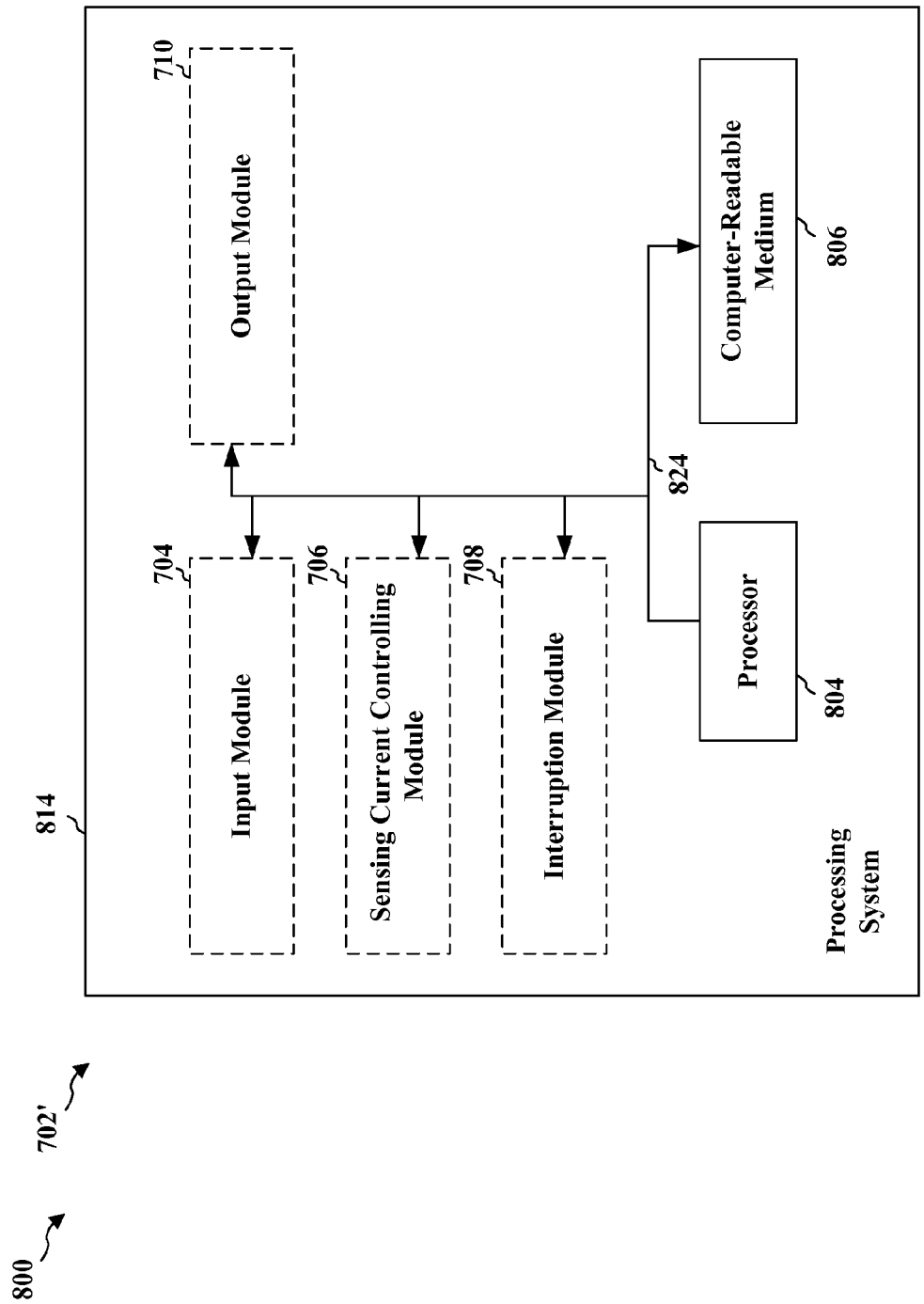
FIG. 8 is a diagram illustrating an example of a hardware implementation for an apparatus employing a processing system.

FIG. 8 is a diagram 800 illustrating an example of a hardware implementation for an apparatus 702' employing a processing system 814. The processing system 814 may be implemented with a bus architecture, represented generally by the bus 824. The bus 824 may include any number of interconnecting buses and bridges depending on the specific application of the processing system 814 and the overall design constraints. The bus 824 links together various circuits including one or more processors and/or hardware modules, represented by the processor 804, the modules 704, 706, 708, 710, and the computer-readable medium 806. The bus 824 may also link various other circuits such as timing sources, peripherals, voltage regulators, and power management circuits, which are well known in the art, and therefore, will not be described any further.

The processing system 814 includes a processor 804 coupled to a computer-readable medium 806. The processor 804 is responsible for general processing, including the execution of software stored on the computer-readable medium 806. The software, when executed by the processor 804, causes the processing system 814 to perform the various functions described supra for any particular apparatus. The computer-readable medium 806 may also be used for storing data that is manipulated by the processor 804 when executing software. The processing system further includes at least one of the modules 704, 706, 708, and 710. The modules may be software modules running in the processor 804, resident/stored in the computer readable medium 806, one or more hardware modules coupled to the processor 804, or some combination thereof.

In one configuration, the apparatus 702/702' for controlling a class D power amplifier, the class D power amplifier including a plurality of output transistors and an overcurrent protection (OCP) circuit, includes means for controlling a sensing current of the OCP circuit with respect to an output current of at least one output transistor of the plurality of output transistors, the sensing current controlled by mirroring the OCP circuit to the at least one output transistor in a closed-loop feedback configuration, and means for interrupting operation of the class D power amplifier when the sensing current of the OCP circuit exceeds a threshold. The aforementioned means may be one or more of the aforementioned modules of the apparatus 702 and/or the processing system 814 of the apparatus 702' configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A class D power amplifier with an overcurrent protection (OCP) circuit, comprising:
   a class D power amplifier having a plurality of output transistors; and
   an OCP circuit mirroring at least one output transistor of the plurality of output transistors in a closed-loop feedback configuration for controlling a sensing current of the OCP circuit with respect to an output current of the at least one output transistor, wherein the OCP circuit interrupts operation of the class D power amplifier when the sensing current exceeds a threshold,
   wherein the threshold varies according to at least one of:
      a process for fabricating the OCP circuit and the class D power amplifier,
      a supply voltage at which the OCP circuit and the class D power amplifier are operated, or
      a mismatch between the OCP circuit and the class D power amplifier.

2. The class D power amplifier of claim 1, wherein the threshold further varies according to:
   a temperature at which the OCP circuit and the class D power amplifier are operated.

3. The class D power amplifier of claim 1, wherein the OCP circuit controls a value of the sensing current to be a ratio of a value of the output current of the at least one output transistor.

4. The class D power amplifier of claim 1, wherein:
   each of the plurality of output transistors of the class D power amplifier comprises a gate node, a drain node, and a source node;
   the OCP circuit comprises a sensing transistor comprising a sensing transistor gate node, a sensing transistor drain node, and a sensing transistor source node; and
   the closed-loop feedback configuration controls the sensing current of the OCP circuit by facilitating a voltage across the sensing transistor drain node and sensing transistor source node to be very close to equal to a voltage across the drain node and source node of the at least one output transistor.

5. The class D power amplifier of claim 4, wherein the OCP circuit is connected to the gate node and the drain node of the at least one output transistor.

6. The class D power amplifier of claim 5, wherein the sensing transistor gate node is connected to the gate node of the at least one output transistor.

7. The class D power amplifier of claim 6, wherein the OCP circuit further comprises an operational amplifier for controlling input node voltages within a closed-loop feedback,
   the operational amplifier comprising an output node, a first input node, and a second input node, and
   the first input node connected to the drain node of the at least one output transistor and the second input node connected to the sensing transistor drain node.

8. The class D power amplifier of claim 7, wherein the OCP circuit further comprises:
   a cascode; and
   a programmable reference current circuit for supplying a reference current to the OCP circuit,
   the output node of the operational amplifier connected to a gate node of the cascode,
   the second input node of the operational amplifier connected to a source node of the cascode, and
   the reference current circuit coupled to a drain node of the cascode.

9. The class D power amplifier of claim 4, wherein the at least one output transistor is a PMOS transistor and the sensing transistor is a PMOS transistor.

10. The class D power amplifier of claim 4, wherein the at least one output transistor is a NMOS transistor and the sensing transistor is a NMOS transistor.

11. A method of controlling a class D power amplifier, the class D power amplifier including a plurality of output transistors and an overcurrent protection (OCP) circuit, the method comprising:
   controlling a sensing current of the OCP circuit with respect to an output current of at least one output transistor of the plurality of output transistors, the sensing current controlled by minoring the OCP circuit to the at least one output transistor in a closed-loop feedback configuration; and
   interrupting operation of the class D power amplifier when the sensing current of the OCP circuit exceeds a threshold,
   wherein the threshold varies according to at least one of:
      a process for fabricating the OCP circuit and the class D power amplifier,
      a supply voltage at which the OCP circuit and the class D power amplifier are operated, or
      a mismatch between the OCP circuit and the class D power amplifier.

12. The method of claim 11, wherein the threshold further varies according to:
   a temperature at which the OCP circuit and the class D power amplifier are operated.

13. The method of claim 11, further comprising controlling a value of the sensing current of the OCP circuit to be a ratio of a value of the output current of the at least one output transistor.

14. The method of claim 11, wherein:
each of the plurality of output transistors of the class D power amplifier comprises a gate node, a drain node, and a source node;
the OCP circuit comprises a sensing transistor comprising a sensing transistor gate node, a sensing transistor drain node, and a sensing transistor source node; and
the closed-loop feedback configuration controls the sensing current of the OCP circuit by facilitating a voltage across the sensing transistor drain node and sensing transistor source node to be very close to equal to a voltage across the drain node and source node of the at least one output transistor.

15. The method of claim 14, further comprising connecting the OCP circuit to the gate node and the drain node of the at least one output transistor.

16. The method of claim 15, further comprising connecting the sensing transistor gate node to the gate node of the at least one output transistor.

17. The method of claim 16, wherein the OCP circuit further comprises an operational amplifier for controlling input node voltages within a closed-loop feedback,
the operational amplifier comprising an output node, a first input node, and a second input node, and
the method further comprising connecting the first input node to the drain node of the at least one output transistor and connecting the second input node to the sensing transistor drain node.

18. The method of claim 17, wherein the OCP circuit further comprises:
a cascode; and
a programmable reference current circuit for supplying a reference current to the OCP circuit,
the method further comprising:
connecting the output node of the operational amplifier to a gate node of the cascode,
connecting the second input node of the operational amplifier to a source node of the cascode, and
coupling the reference current circuit to a drain node of the cascode.

19. The method of claim 11, wherein the at least one output transistor is a PMOS transistor and the sensing transistor is a PMOS transistor.

20. The method of claim 11, wherein the at least one output transistor is a NMOS transistor and the sensing transistor is a NMOS transistor.

21. An apparatus for controlling a class D power amplifier, the class D power amplifier including a plurality of output transistors and an overcurrent protection (OCP) circuit, the apparatus comprising:
means for controlling a sensing current of the OCP circuit with respect to an output current of at least one output transistor of the plurality of output transistors, the sensing current controlled by mirroring the OCP circuit to the at least one output transistor in a closed-loop feedback configuration; and
means for interrupting operation of the class D power amplifier when the sensing current of the OCP circuit exceeds a threshold,
wherein the threshold varies according to at least one of:

a process for fabricating the OCP circuit and the class D power amplifier,
a supply voltage at which the OCP circuit and the class D power amplifier are operated, or
a mismatch between the OCP circuit and the class D power amplifier.

22. The apparatus of claim 21, wherein the threshold further varies according to:
a temperature at which the OCP circuit and the class D power amplifier are operated.

23. The apparatus of claim 21, wherein the means for controlling the sensing circuit is configured to control a value of the sensing current of the OCP circuit to be a ratio of a value of the output current of the at least one output transistor.

24. The apparatus of claim 21, wherein:
each of the plurality of output transistors of the class D power amplifier comprises a gate node, a drain node, and a source node;
the OCP circuit comprises a sensing transistor comprising a sensing transistor gate node, a sensing transistor drain node, and a sensing transistor source node; and
the closed-loop feedback configuration controls the sensing current of the OCP circuit by facilitating a voltage across the sensing transistor drain node and sensing transistor source node to be very close to equal to a voltage across the drain node and source node of the at least one output transistor.

25. The apparatus of claim 24, wherein the means for controlling the sensing circuit is configured to connect the OCP circuit to the gate node and the drain node of the at least one output transistor.

26. The apparatus of claim 25, wherein the means for controlling the sensing circuit is configured to connect the sensing transistor gate node to the gate node of the at least one output transistor.

27. The apparatus of claim 26, wherein the OCP circuit further comprises an operational amplifier for controlling input node voltages within a closed-loop feedback,
the operational amplifier comprising an output node, a first input node, and a second input node, and
the means for controlling the sensing circuit is configured to connect the first input node to the drain node of the at least one output transistor and connect the second input node to the sensing transistor drain node.

28. The apparatus of claim 27, wherein the OCP circuit further comprises:
a cascode; and
a programmable reference current circuit for supplying a reference current to the OCP circuit,
and the means for controlling the sensing circuit is configured to:
connect the output node of the operational amplifier to a gate node of the cascode,
connect the second input node of the operational amplifier to a source node of the cascode, and
couple the reference current circuit to a drain node of the cascode.

29. The apparatus of claim 21, wherein the at least one output transistor is a PMOS transistor and the sensing transistor is a PMOS transistor.

30. The apparatus of claim 21, wherein the at least one output transistor is a NMOS transistor and the sensing transistor is a NMOS transistor.

* * * * *